United States Patent
Ohyama et al.

(10) Patent No.: US 10,180,519 B2
(45) Date of Patent: Jan. 15, 2019

(54) ORGANIC LIGHT EMITTING DIODE DEVICE

(71) Applicant: SAMSUNG ELECTRONICS CO., LTD., Suwon-si (KR)

(72) Inventors: Tsuyoshi Ohyama, Suwon-si (KR); Ju Hyun Kim, Anyang-si (KR); Hyunseok Choi, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/399,380

(22) Filed: Jan. 5, 2017

(65) Prior Publication Data

US 2017/0336546 A1    Nov. 23, 2017

(30) Foreign Application Priority Data

May 19, 2016  (KR) .......... 10-2016-0061389

(51) Int. Cl.
*H01L 29/08*  (2006.01)
*G02B 5/30*   (2006.01)
(Continued)

(52) U.S. Cl.
CPC ........ *G02B 5/3016* (2013.01); *H01L 51/5265* (2013.01); *H01L 51/5275* (2013.01);
(Continued)

(58) Field of Classification Search
CPC ... H01L 51/5281; H01L 21/775; H01L 27/12; H01L 27/13; H01L 29/66757; H01L 51/0545; G02B 5/3046
(Continued)

(56) References Cited

U.S. PATENT DOCUMENTS

| 6,565,974 B1 | 5/2003 | Uchiyama et al. |
| 8,119,026 B2 | 2/2012 | Parri et al. |

(Continued)

FOREIGN PATENT DOCUMENTS

| JP | 3325560 | 9/2002 |
| JP | 2010522892 | 7/2010 |

OTHER PUBLICATIONS

Daisuke Yokoyama, et al., "In situ real-time spectroscopic ellipsometry measurement for the investigation of molecular orientation in organic amorphous multilayer structures", Journal of Applied Physics, vol. 107, (2010), pp. 123512-1-123512-7.
(Continued)

*Primary Examiner* — Thinh T Nguyen
(74) *Attorney, Agent, or Firm* — Cantor Colburn LLP

(57) ABSTRACT

An organic light emitting diode device includes an organic light emitting display panel and a circular polarizing plate which includes a polarizer and a compensation film including a liquid crystal layer which includes a first surface and a second surface, and liquid crystals that tilt obliquely with respect to an extension direction of the first and second surfaces of the liquid crystal layer where tilt angles of the liquid crystals with respect to the extension direction of the liquid crystal layer become gradually larger from the first surface to the second surface of the liquid crystal layer in a thickness direction of the liquid crystal layer, and a maximum tilt angle of the liquid crystals with respect to the extension direction of the liquid crystal layer is determined based on a thickness direction phase delay generated in a thickness direction of the organic light emitting display panel.

17 Claims, 8 Drawing Sheets

(51) Int. Cl.
  *H01L 51/52*    (2006.01)
  *H01L 27/32*    (2006.01)
  *F21V 8/00*     (2006.01)

(52) U.S. Cl.
  CPC ........ *H01L 51/5281* (2013.01); *G02B 6/0068* (2013.01); *H01L 27/3218* (2013.01); *H01L 27/3232* (2013.01)

(58) Field of Classification Search
  USPC ...... 257/40, 59, 72, 79; 438/82, 99, 48, 128, 438/151
  See application file for complete search history.

(56) References Cited

U.S. PATENT DOCUMENTS

| | | |
|---|---|---|
| 9,250,473 B2 | 2/2016 | Kim et al. |
| 9,583,543 B2 * | 2/2017 | Kamada ............... H01L 27/3232 |
| 9,766,384 B2 * | 9/2017 | Kamada ................ G02B 5/3083 |
| 2014/0293420 A1 | 10/2014 | Ko et al. |
| 2014/0375935 A1 | 12/2014 | Yamada et al. |
| 2016/0161785 A1 * | 6/2016 | Kamada ............... H01L 27/3232 257/40 |
| 2016/0211486 A1 * | 7/2016 | Ohyama ........... G02F 1/133634 |
| 2016/0233273 A1 * | 8/2016 | Ohyama .............. G02B 5/3083 |

OTHER PUBLICATIONS

Jörg Frischeisen, et al., "Increased light outcoupling efficiency in dye-doped small molecule organic light-emitting diodes with horizontally oriented emitters", Organic Electronics, vol. 12, (2011), pp. 809-817.

* cited by examiner

ORGANIC LIGHT EMITTING DIODE DEVICE

This application claims priority to Korean Patent Application No. 10-2016-0061389, filed on May 19, 2016, and all the benefits accruing therefrom under 35 U.S.C. § 119, the content of which in its entirety is herein incorporated by reference.

BACKGROUND

1. Field

Embodiments of the invention are related to an organic light emitting diode device.

2. Description of the Related Art

Recently, as a demand has increased for a lightness and a thinness of a display device such as a monitor, a television, or the like, an organic light emitting diode ("OLED") device has drawn attention. The OLED device, as a self-luminescent display device, may operate without using a separate backlight, and thus may realize a thin and flexible display device.

SUMMARY

A metal electrode and a metal wire of an organic light emitting diode ("OLED") device may reflect external light, and a visibility and a contrast ratio thereof may be deteriorated by reflection of the exterior light, reducing display quality.

A circular polarizing plate having predetermined optical properties may be attached to a surface of an organic light emitting display panel to reduce reflection of the external light. The circular polarizing plate may reduce reflected light from leaking outside and thus realize an anti-reflection effect.

An embodiment provides an organic light emitting diode ("OLED") device which effectively realizes the anti-reflection effect and thus improving display characteristics.

Another embodiment provides a circular polarizing plate applicable to the OLED device.

According to an embodiment, an OLED device includes an organic light emitting display panel and a circular polarizing plate where the circular polarizing plate includes a polarizer and a compensation film including a liquid crystal layer including a first surface and a second surface facing each other, the liquid crystal layer includes a plurality of liquid crystals that tilt obliquely with respect to an extension direction of the first and second surfaces of the liquid crystal layer, tilt angles of the liquid crystals with respect to the extension direction of the liquid crystal layer become gradually larger from the first surface to the second surface of the liquid crystal layer in a thickness direction of the liquid crystal layer, and a maximum tilt angle of the liquid crystals with respect to the extension direction of the liquid crystal layer is determined based on a thickness direction phase delay generated in a thickness direction of the organic light emitting display panel.

In an embodiment, the maximum tilt angle of the liquid crystals may be different from a maximum tilt angle of the liquid crystals when at least one of a reflectance and a reflection color is minimized where the reflectance and the reflection color are measured in a side direction of the circular polarizing plate while disposing a reflector on one surface of the circular polarizing plate.

In an embodiment, the maximum tilt angle of the liquid crystals may be greater than a maximum tilt angle of the liquid crystals when at least one of a reflectance and a reflection color is minimized where the reflectance and the reflection color are measured in a side direction of the circular polarizing plate while disposing a reflector on one surface of the circular polarizing plate.

In an embodiment, an average tilt angle of liquid crystals may satisfy Inequation 1.

$$(T_0+R_{thp}/4)\times 0.6 \leq T_1 \leq (T_0+R_{thp}/4)\times 1.4 \qquad \text{[Inequation 1]}$$

In Inequation 1,
$T_1$ denotes an average tilt angle of liquid crystals,
$T_0$ denotes an average tilt angle of liquid crystals when at least one of a reflectance and a reflection color is minimized where the reflectance and the reflection color are measured in a side direction of the circular polarizing plate while disposing a reflector on one surface of the circular polarizing plate, and
$R_{thp}$ denotes a thickness direction phase delay of the organic light emitting display panel.

In an embodiment, the average tilt angle of liquid crystals may satisfy Inequation 2.

$$(T_0+R_{thp}/4)\times 0.8 \leq T_1 \leq (T_0+R_{thp}/4)\times 1.2 \qquad \text{[Inequation 2]}$$

In Inequation 2,
$T_1$ denotes an average tilt angle of liquid crystals,
$T_0$ denotes an average tilt angle of liquid crystals when at least one of a reflectance and a reflection color is minimized where the reflectance and the reflection color are measured in a side direction of the circular polarizing plate while disposing a reflector on one surface of the circular polarizing plate, and
$R_{thp}$ denotes a thickness direction phase delay of the organic light emitting display panel.

In an embodiment, the maximum tilt angle of the liquid crystals may range from about 45 degrees (°) to about 90°.

In an embodiment, the average tilt angle of liquid crystals may range from about 30° to about 60°.

In an embodiment, the organic light emitting display panel may satisfy refractive indices of Inequations 3 and 4.

$$n_{xp} > n_{zp} \qquad \text{[Inequation 3]}$$

$$n_{yp} > n_{zp} \qquad \text{[Inequation 4]}$$

In Inequations 3 and 4,
$n_{xp}$ denotes a refractive index in a direction having a highest in-plane refractive index of the organic light emitting display panel,
$n_{yp}$ denotes a refractive index in a direction having a lowest in-plane refractive index of the organic light emitting display panel, and
$n_{zp}$ denotes a refractive index in a thickness direction of the organic light emitting display panel.

In an embodiment, the organic light emitting display panel may satisfy a refractive index of Inequation 5.

$$n_{xp}=n_{yp}>n_{zp} \qquad \text{[Inequation 5]}$$

In Inequation 5,
$n_{xp}$ denotes a refractive index in a direction having a highest in-plane refractive index of the organic light emitting display panel,
$n_{yp}$ denotes a refractive index in a direction having a lowest in-plane refractive index of the organic light emitting display panel, and $n_{zp}$ denotes a refractive index in a thickness direction of the organic light emitting display panel.

In an embodiment, the organic light emitting display panel may have an absolute value of thickness direction phase delay of about 20 nanometers to about 200 nanometers.

In an embodiment, the first surface of the liquid crystal layer may face the polarizer and the second surface of the liquid crystal layer may face the organic light emitting display panel.

In an embodiment, the first surface of the liquid crystal layer may face the organic light emitting display panel and the second surface of the liquid crystal layer may face the polarizer.

In an embodiment, the compensation film may further include an auxiliary layer on one surface of the liquid crystal layer and the auxiliary layer may satisfy Inequation 6.

$$n_{z2} > n_{x2} = n_{y2} \qquad \text{[Inequation 6]}$$

In Inequation 6, $n_{x2}$ denotes a refractive index in a direction having a highest in-plane refractive index of the auxiliary layer, $n_{y2}$ denotes a refractive index in a direction having a lowest in-plane refractive index of the auxiliary layer, and $n_{z2}$ denotes a refractive index in a thickness direction of the auxiliary layer In an embodiment, the auxiliary layer may include a polymer, a liquid crystal, or a combination thereof.

In an embodiment, the auxiliary layer may include a homeotropic liquid crystal.

In an embodiment, the organic light emitting display panel may include an organic layer including an aligned organic molecule.

In an embodiment, the organic light emitting display panel may include an organic layer including a deposited organic molecule.

In an embodiment, the organic light emitting display panel may have a microcavity structure.

According to another embodiment, a circular polarizing plate for an OLED device includes a polarizer and a compensation film including a liquid crystal layer including a first surface and a second surface facing each other, where the liquid crystal layer includes a plurality of liquid crystals that tilt obliquely with respect to an extension direction of the first and second surfaces of the liquid crystal layer, tilt angles of the liquid crystals with respect to the extension direction of the liquid crystal layer become gradually larger from the first surface to the second surface of the liquid crystal layer in a thickness direction of the liquid crystal layer, and a maximum tilt angle of the liquid crystals is different from a maximum tilt angle of the liquid crystals when at least one of a reflectance and a reflection color is minimized where the reflectance and the reflection color are measured in a side direction of the circular polarizing plate while disposing a reflector on one surface of the circular polarizing plate.

The maximum tilt angle of the liquid crystals may be greater than a maximum tilt angle of the liquid crystals when at least one of a reflectance and a reflection color is minimized where the reflectance and the reflection color are measured in a side direction of the circular polarizing plate while disposing a reflector on one surface of the circular polarizing plate.

BRIEF DESCRIPTION OF THE DRAWINGS

The above and other embodiments, advantages and features of this disclosure will become more apparent by describing in further detail embodiments thereof with reference to the accompanying drawings, in which.

DETAILED DESCRIPTION

Figure 1:
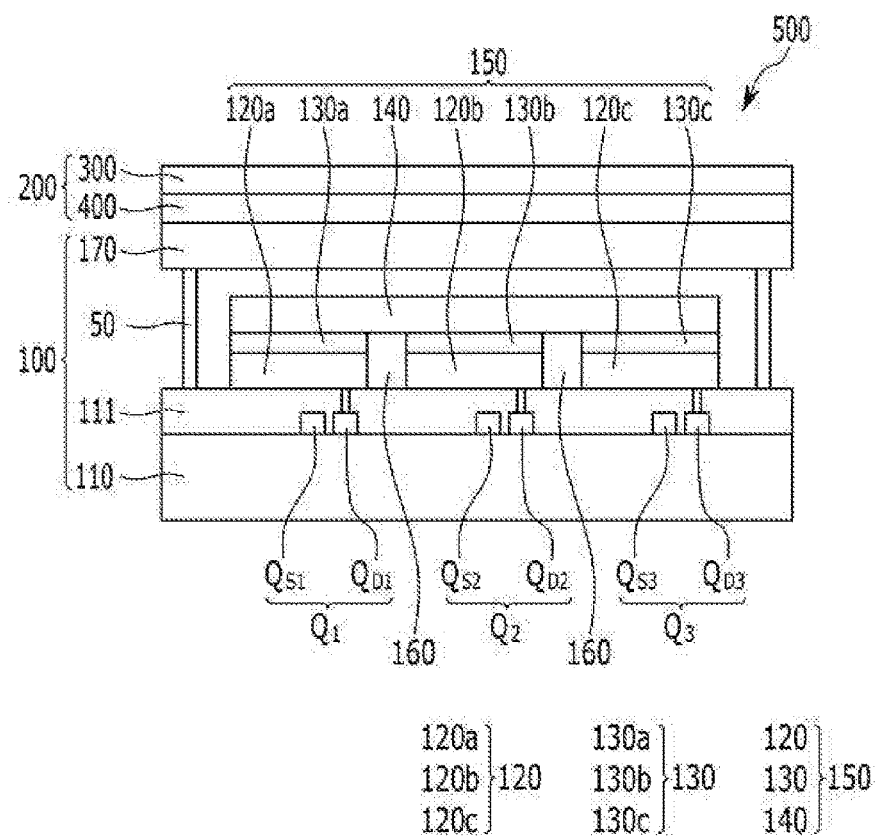
FIG. 1 is a cross-sectional view schematically showing an organic light emitting diode ("OLED") device according to an embodiment.

Example embodiments of the present disclosure will hereinafter be described in detail, and may be easily performed by those who have common knowledge in the related art. However, this disclosure may be embodied in many different forms, and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, an organic light emitting diode ("OLED") device according to an embodiment is described referring to drawings.

Figure 2:
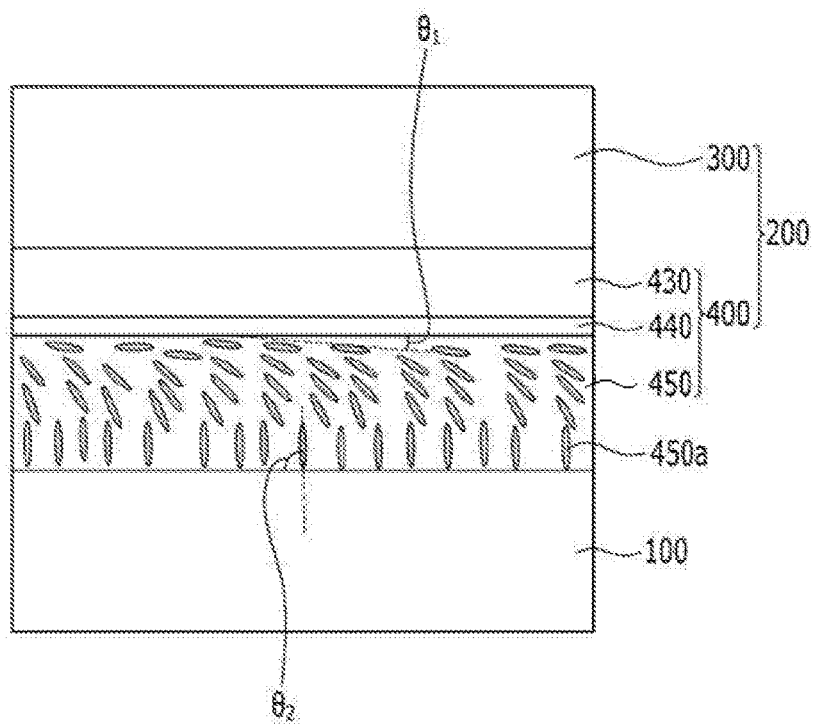
FIG. 2 is a cross-sectional view of an OLED device enlarging an embodiment of a circular polarizing plate that is applied to the OLED device of FIG. 1.

FIG. 1 is a cross-sectional view schematically showing an OLED device according to an embodiment and FIG. 2 is a cross-sectional view of an OLED device enlarging an embodiment of a circular polarizing plate that is applied to the OLED device of FIG. 1.

Referring to FIG. 1, an embodiment of an OLED device 500 includes an organic light emitting display panel 100 and a circular polarizing plate 200.

In such an embodiment, the organic light emitting display panel 100 includes a plurality of unit pixel group for displaying full colors, and the plurality of unit pixel group may be alternately disposed along a column and/or a raw. In an embodiment, each unit pixel group includes a plurality of pixel, which may have various arrangements, for example, a 2×2 matrix, a 3×1 matrix, and the like, for example. In an embodiment, each unit pixel group may further include, for example, a red pixel, a green pixel, and a blue pixel and, for example, further a white pixel, for example. However, the invention is not limited thereto, and the composition and disposition of the unit pixel group may be variously modified.

Referring to FIG. 1, an organic light emitting display panel 100 includes a base substrate 110, thin film transistor ("TFT") arrays $Q_1$, $Q_2$, and $Q_3$ disposed on the base substrate 110, an OLED 150, and an opposed substrate 170.

In an embodiment, the base substrate 110 may be a glass substrate, a polymer substrate, or a semiconductor substrate. In an embodiment, the polymer substrate may be, for example, polycarbonate ("PC"), polymethylmethacrylate, polyethyleneterephthalate, polyethylenenaphthalate, polyamide, polyethersulfone, a copolymer thereof, a derivative thereof, or a combination thereof, but is not limited thereto. The polymer substrate may easily implement a flexible device.

The TFT arrays $Q_1$, $Q_2$, and $Q_3$ includes switching TFTs $Q_{S1}$, $Q_{S2}$, and $Q_{S3}$ and driving TFTs $Q_{D1}$, $Q_{D2}$, and $Q_{D3}$ disposed in each pixel, and herein, the switching TFTs $Q_{S1}$, $Q_{S2}$, and $Q_{S3}$ and the driving TFTs $Q_{D1}$, $Q_{D2}$, and $Q_{D3}$ are electrically connected one another.

The switching TFTs $Q_{S1}$, $Q_{S2}$, and $Q_{S3}$ include a control terminal, an input terminal, and an output terminal, and herein, the control terminal is connected to a gate line, the input terminal is connected to a data line, and the output terminal is connected to the driving TFTs $Q_{D1}$, $Q_{D2}$, and $Q_{D3}$. The switching TFTs $Q_{S1}$, $Q_{S2}$, and $Q_{S3}$ respond to a scan signal applied to the gate line and transport a data signal applied to the data line to the driving TFTs $Q_{D1}$, $Q_{D2}$, and $Q_{D3}$.

The driving TFTs $Q_{D1}$, $Q_{D2}$, and $Q_{D3}$ also include a control terminal, an input terminal, and an output terminal, and herein, the control terminal is connected to the switching TFTs $Q_{S1}$, $Q_{S2}$, and $Q_{S3}$, the input terminal is connected to a driving voltage line, and the output terminal is connected to the OLED 150. The driving TFTs $Q_{D1}$, $Q_{D2}$, and $Q_{D3}$ discharge an output current having a different magnitude depending on a voltage applied between the control terminal and the output terminal.

An insulation layer 111 is disposed on the TFT arrays $Q_1$, $Q_2$, and $Q_3$. A plurality of contact holes partially exposing the switching TFTs $Q_{S1}$, $Q_{S2}$, and $Q_{S3}$ and the driving TFTs $Q_{D1}$, $Q_{D2}$, and $Q_{D3}$ is defined in the insulation layer 111.

The OLED 150 is disposed on the insulation layer 111. The OLED 150 includes a first OLED displaying a first color, a second OLED displaying a second color second, and a third OLED displaying a third color second, where the first color, the second color, and the third color may be one of three primary colors, respectively, for example.

The OLED 150 includes a lower electrode 120, an organic layer 130, and an upper electrode 140. The lower electrode 120 includes a first lower electrode 120a, a second lower electrode 120b, and a third lower electrode 120c disposed in the first to third OLEDs, respectively, and the organic layer 130 includes a first organic layer 130a, a second organic layer 130b, and a third organic layer 130c disposed in the first to third OLEDs. The upper electrode 140 may be a common electrode shared in the first to third OLEDs. In an embodiment, barrier ribs 160 including, for example, an insulating material such as polyimide may be provided between the first OLED, the second OLED, and the third OLED.

The lower electrode 120 is connected to the output terminal of the driving TFTs $Q_{D1}$, $Q_{D2}$, and $Q_{D3}$, and the upper electrode 140 is connected to a common voltage.

One of the lower electrode 120 and the upper electrode 140 may be an anode, and the other may be a cathode. In an embodiment, the lower electrode 120 may be an anode, and the upper electrode 140 may be a cathode. The anode is an electrode into which holes are injected and may include a conductive material having a high work function, and the cathode is an electrode into which electrons are injected and may include a conductive material having a low work function.

In an embodiment, at least one of the lower electrode 120 and the upper electrode 140 may include a transparent or semi-transparent conductive material from which emitted light exits outside, and may be, for example, a conductive oxide thin film such as indium tin oxide ("ITO") or indium zinc oxide ("IZO") and/or a metal thin film such as an Ag or Al thin film.

The organic layer 130 includes an emission layer and may further include an auxiliary layer. The emission layer may include organic materials and may intrinsically emit light of red, green, blue, or the like when applying a voltage to the lower electrode 120 and the upper electrode 140. The auxiliary layer may include a hole transport layer, a hole injection layer, an electron injection layer, and/or an electron transport layer in order to balance electrons and holes, but is not limited thereto. In an embodiment, the organic layer 130 may substantially include organic molecules aligned in one direction, and the organic molecules of the organic layer 130 may be, for example, provided by a deposition such as a vacuum deposition.

FIG. 1 shows that the organic layer 130 is separated per each pixel but not limited thereto and may be provided as a one common layer in the OLED 150 and have a structure that an emission layer emitting first light, an emission layer emitting second light, and an emission layer emitting third light are stacked. Herein, the organic layer 130 may further include a color filter (not shown) at the bottom of the organic layer 130 or on the top of the organic layer 130.

The lower electrode 120, the organic layer 130, and the upper electrode 140 may exhibit a microcavity effect. The microcavity effect indicates that light at a particular wavelength is amplified by reinforcement/interference, as light coming from the emission layer is repeatedly reflected between a reflection layer and a transparent layer (e.g., semi transparent layer or fully transparent layer) spaced apart by a length of an optical path, and thus light corresponding to a resonance wavelength of the microcavity may be reinforced, while light at the other wavelengths may be suppressed.

In order to obtain the microcavity effect, one of the lower electrode 120 and the upper electrode 140 may include a reflection layer, while the other one thereof may include a transparent layer (e.g., semi transparent layer or fully transparent layer). The light reinforced due to the microcavity effect may have a wavelength range determined depending on the length of an optical path, and the length of the optical path may be, for example, determined as a distance between the lower electrode 120 and the upper electrode 140. In other words, the red pixel may have an optical path length through which light in a red wavelength region is selectively amplified, the green pixel may have an optical path length through which light in a green wavelength region is selectively amplified, and the blue pixel may have an optical path length through which light in a blue wavelength region is selectively amplified. In this way, the microcavity effect may selectively reinforce light in a particular wavelength region in each pixel and thus increase color purity.

In an embodiment, an opposed substrate 170 may be, for example, an encapsulation substrate. In an embodiment, the encapsulation substrate may include glass, metal, or a polymer, and the polymer may be, for example, polyethylene terephthalate ("PET"), polyvinyl alcohol ("PVA"), PC, triacetyl cellulose ("TAC"), a copolymer thereof, a derivative thereof, and/or a combination thereof. The encapsulation substrate may seal the OLED 150 and prevents the inflow of moisture and/or oxygen from the outside. The base substrate 110 and the opposed substrate 170 may be combined with a sealing material 50.

FIG. 1 shows one example structure of the organic light emitting display panel 100, but the organic light emitting display panel 100 may have various structures and be applied to any known organic light emitting display panel.

The circular polarizing plate 200 is disposed on one surface of the organic light emitting display panel 100 and may be disposed at the side emitting light of the organic light emitting display panel 100. FIG. 1 shows that the circular polarizing plate 200 is disposed on one surface of the opposed substrate 170 as a top emission structure that light emits from the opposed substrate 170, but the invention is not limited thereto and may have a bottom emission structure that light emits from the base substrate 110, where the circular polarizing plate 200 may be disposed outside of the base substrate 110.

Referring to FIGS. 1 and 2, the circular polarizing plate 200 includes a polarizer 300 and a compensation film 400.

The polarizer 300 may be a linear polarizer to convert light that enters from outside (hereinafter, referred to as "incident light") into linearly polarized light.

In an embodiment, the polarizer 300 may be, for example, a polarizer including elongated PVA, and the polarizer may be, for example, made by a method including elongating a PVA film adsorbing iodine or a dichroic dye thereto, and treating it with boric acid and washing the same.

In an embodiment, the polarizer 300 may be, for example, a polarizing film prepared by melt-blending a polymer resin and a dichroic dye, and the polarizing film may be, for example, made by a method including mixing a polymer and a dichroic dye and melting the resultant at a temperature above the melting point of the polymer to manufacture it in a form of a sheet. In an embodiment, the polymer may be a hydrophobic polymer, for example, polyolefin.

In an embodiment, the compensation film 400 circularly polarizes linearly polarized light passed through the polarizer 300 to generate phase retardation, and may be, for example, for example a λ/4 plate or a λ/2 plate, for example a λ/4 plate. In an embodiment, the λ/4 plate may have in-plane retardation ($R_e$) of, for example, about 120 nanometers (nm) to about 160 nanometers (nm) for incident light of a 550 nm wavelength (hereinafter referred to as 'a reference wavelength'). In an embodiment, the λ/2 plate may have in-plane retardation ($R_e$) of, for example, about 220 nm to about 320 nm for incident light of a reference wavelength.

The compensation film 400 includes a substrate 430, an alignment layer 440, and a liquid crystal layer 450.

In an embodiment, the substrate 430 may be, for example, a glass substrate or a polymer substrate. In an embodiment, the polymer substrate may have optical isotropy and may be, for example, a substrate including PET, PVA, PC, TAC, a derivative thereof and/or a combination thereof, but is not limited thereto. When the compensation film 400 includes another lower layer besides the substrate, the substrate 430 may be the lower layer. The substrate 430 may be omitted as needed.

The alignment layer 440 provides a pretilt angle with the post-described liquid crystals of the liquid crystal layer 450, and thus controls alignment of the liquid crystals. In an embodiment, the alignment layer 140 may include, for example, PVA, polyolefin, polyamic acid, polyimide, or a combination thereof. The alignment layer 140 may have improved liquid crystal aligning property through a physical treatment such as rubbing on the surface or a photo-treatment such as photo-alignment. The alignment layer 440 may be omitted as needed.

The liquid crystal layer 450 may include a plurality of liquid crystal 450a that tilt obliquely with respect to the surface of the liquid crystal layer 450. Herein, the tilting obliquely with respect to the surface of the liquid crystal layer 450 means that the liquid crystals are not horizontally aligned with the surface of the liquid crystal layer 450, and each liquid crystal 450a may be tilted at an angle of greater than about 0 degree (°) and less than or equal to about 90° with the surface of the liquid crystal layer 450.

In an embodiment, an angle (hereinafter referred to as 'a tilt angle') at which the liquid crystal 450a is tilted with respect to the surface of the liquid crystal layer 450 may change along the thickness direction (e.g., a vertical direction in FIG. 2) of the liquid crystal layer 450, and for example, the tilt angle of the liquid crystals 450a may gradually change along the thickness direction of the liquid crystal layer 450. That is, the liquid crystal layer 450 may have a bottom tilt structure where a tilt angle of the liquid crystals 450a becomes gradually larger from the top of the liquid crystal layer 150 to the bottom of the liquid crystal layer 450. In an embodiment, when the liquid crystal layer 450 faces the polarizer 300 and has a first surface (e.g., upper surface) facing the alignment layer 440 and a second surface (e.g., lower surface) facing the organic light emitting display panel 100, a tilt angle of the liquid crystals 450a may become gradually changed from the first surface to the second surface of the liquid crystal layer 450 in a thickness of the liquid crystal layer 450, for example.

In this way, when the liquid crystal layer 450 has the tilt angle of the liquid crystal 450a becomes gradually changed in a thickness direction of the liquid crystal layer 450, anti-reflection effects of external light in all directions including a front surface and a side surface may be improved.

Figure 6:
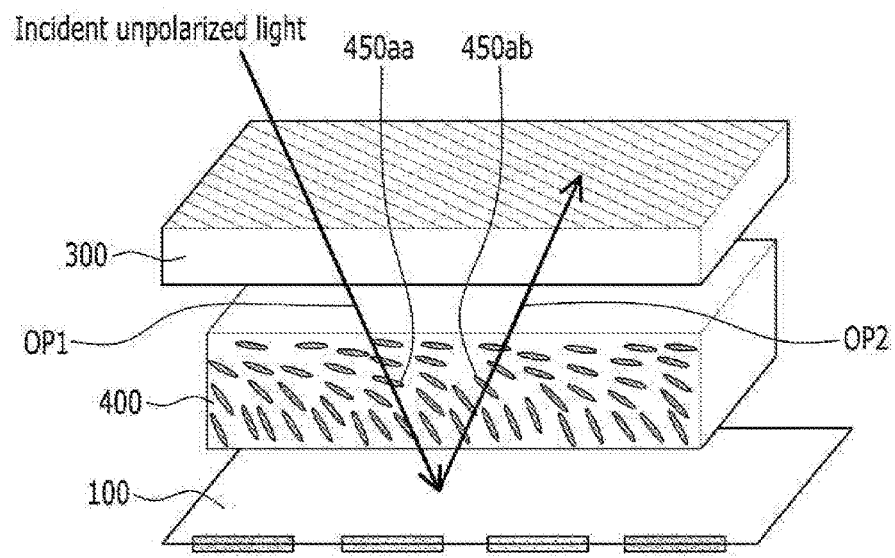
FIG. 6 is a schematic view showing a viewing angle improvement principle of the OLED devices of FIGS. 1 and 2.

FIG. 6 is a schematic view showing a visibility improvement principle of the OLED devices of FIGS. 1 and 2

Referring to FIG. 6, external light passes through a first optical path OP1 in which the light passes through the polarizer 300 and the compensation film 400 and reaches the organic light emitting display panel 100 and passes through a second optical path OP2 in which the light is reflected from the display panel 100 and repassed through the compensation film 400. The light has a polarization direction that is changed through the first and second optical paths OP1 and OP2 and does not pass through the polarizer 300, showing an external light anti-reflection effect.

Herein, the first and second optical paths OP1 and OP2 may substantially form a reverted image as a reference of the organic light emitting display panel 100. Accordingly, the compensation film 400 includes liquid crystals that are obliquely tilted and aligned in one direction, but when external light sequentially passes the first optical path OP1 and the second optical path OP2 having opposite directions from each other, a phase delay may be adjusted by summing the oblique alignment of liquid crystals 450aa in the first optical path OP1 and the oblique alignment of liquid crystals 450ab in the second optical path OP2. Accordingly, an anti-reflection effect may be substantially equivalent in all directions, and a color shift due to a reflection of external light at the side surface as well as at the front surface may be effectively prevented, thereby improving side visibility.

Herein, the compensation film 400 may have a thickness direction phase delay determined by the tilt angle of the liquid crystals 450a of the liquid crystal layer 450, and thus the tilt angle of the liquid crystals 450a of the liquid crystal layer 450 may be optically designed by considering a thickness direction phase delay due to optical anisotropy of the organic light emitting display panel 100 as well as a tilt angle when the circular polarizing plate 200 has a maximum anti-reflection effect.

In other words, when a minimum tilt angle ($\theta_1$) of the liquid crystals 450a in the first surface of the liquid crystal layer 450 is substantially equivalent to a pretilt angle with the alignment layer 440, a maximum tilt angle ($\theta_2$) of the liquid crystals 450a in the second surface of the liquid crystal layer 450 may be optically designed by considering a maximum tilt angle of the liquid crystals when the circular polarizing plate 200 has a maximum anti-reflection effect, and a phase delay due to optical anisotropy of the organic light emitting display panel 100.

Herein, a tilt angle of the liquid crystals 450a when an anti-reflection effect of the circular polarizing plate 200 is maximum may be an angle when at least one of a reflectance and a reflection color is minimized where the reflectance and the reflection color are measured in a side direction of the circular polarizing plate 200 while disposing a reflector on one surface of the circular polarizing plate 200. In an embodiment, the side direction may be, for example, about 30°, about 45°, or about 60° with reference to the first surface of the liquid crystal layer 450.

The organic light emitting display panel 100 may exhibit optical anisotropy due to various factors. In an embodiment, the organic light emitting display panel 100 may exhibit optical anisotropy due to arrangement of organic molecules of the organic layer 130. In an embodiment, organic molecules of an emission layer in the organic layer 130 may be aligned in one direction in order to increase a light extraction effect. In an embodiment, the organic layer 130 may be disposed in a vacuum deposition method to align the organic molecules in one direction. In an embodiment, the organic molecules of an emission layer and/or an auxiliary layer in the organic layer 130 may be aligned in one direction in order to increase charge transportation of the OLED 150. In an embodiment, the optical anisotropy may appear by a microcavity effect of the organic light emitting display panel 100. In an embodiment, the optical anisotropy may appear by an organic material such as polyimide used in the organic light emitting display panel 100.

The organic light emitting display panel 100 may have, for example, optical anisotropy satisfying refractive indices of Inequations 3 and 4.

$$n_{xp} > n_{zp} \qquad \text{[Inequation 3]}$$

$$n_{yp} > n_{zp} \qquad \text{[Inequation 4]}$$

In Inequations 3 and 4, $n_{xp}$ denotes a refractive index in a direction having a highest in-plane refractive index of the organic light emitting display panel, $n_{yp}$ denotes a refractive index in a direction having a lowest in-plane refractive index of the organic light emitting display panel, and $n_{zp}$ denotes a refractive index in a thickness direction of the organic light emitting display panel.

The organic light emitting display panel 100 may satisfy a refractive index of Inequation 5.

$$n_{xp} = n_{yp} > n_{zp} \qquad \text{[Inequation 5]}$$

In Inequation 5, $n_{xp}$ denotes a refractive index in a direction having a highest in-plane refractive index of the organic light emitting display panel, $n_{yp}$ denotes a refractive index in a direction having a lowest in-plane refractive index of the organic light emitting display panel, and $n_{zp}$ denotes a refractive index in a thickness direction of the organic light emitting display panel.

In Inequation 5, $n_{xp}$ and $n_{yp}$ may be substantially equivalent as well as completely the same and herein, regarded as substantially equivalent when the difference between the $n_{xp}$ and $n_{yp}$ is less than or equal to about 0.01, for example, less than or equal to about 0.001.

When the liquid crystals 450a of the liquid crystal layer 450 has a maximum tilt angle determined as an angle when the circular polarizing plate 200 has a maximum anti-reflection effect, the maximum tilt angle has a difference from a maximum tilt angle when at least one of reflectance and reflection color is minimized in an OLED device in which the organic light emitting display panel 100 and the circular polarizing plate 200 are combined by the optical anisotropy of the organic light emitting display panel 100 and thus may deteriorate an actual anti-reflection effect.

Accordingly, the maximum tilt angle of the liquid crystals 450a of the liquid crystal layer 450 may be optically designed considering a thickness direction phase delay in a thickness direction of the organic light emitting display panel 100. In an embodiment, an absolute value of the thickness direction phase delay of the organic light emitting display panel 100 may be about 20 nm to about 200 nm, for example. Within the range, the absolute value may be, for example, about 20 nm to about 160 nm or about 20 nm to about 120 nm.

In an embodiment, the tilt angle of the liquid crystals 450a may be optically designed to be different from the tilt angle of the liquid crystals 450a when at least one of a reflectance and a reflection color is minimized where the reflectance and the reflection color are measured in a side direction of the circular polarizing plate 200 while disposing a reflector on one surface of the circular polarizing plate, for example. In an embodiment, the maximum tilt angle of the liquid crystals 450a, that is a tilt angle of the liquid crystals disposed at the second surface of the liquid crystal layer 450 may be greater than the maximum tilt angle of the liquid crystals 450a when at least one of a reflectance and a reflection color is minimized where the reflectance and the reflection color are measured in a side direction of the circular polarizing plate 200 while disposing a reflector on one surface of the circular polarizing plate, for example.

In this way, when the tilt angle of the liquid crystals 450a of the liquid crystal layer 450 is optically designed, an anti-reflection effect of the OLED display may be effectively improved by considering a thickness direction phase delay by optical anisotropy of the organic light emitting display panel 100 as well as a phase delay when an anti-reflection effect of the circular polarizing plate 200 is maximum.

In an embodiment, the tilt angle of the liquid crystals 450a of the liquid crystal layer 450 may be expressed as an average tilt angle, for example. Herein, the average tilt angle may be an average value of the tilt angles of the liquid crystals 450a of the liquid crystal layer 450.

In an embodiment, the average tilt angle of the liquid crystals 450a may be greater than the average tilt angle of the liquid crystals 450a when at least one of a reflectance and a reflection color is minimized where the reflectance and the reflection color are measured in a side direction of the circular polarizing plate 200 while disposing a reflector on one surface of the circular polarizing plate 200, for example.

The average tilt angle of the liquid crystals 450a may, for example, satisfy Inequation 1 considering a phase delay in a thickness direction of the organic light emitting display panel 100.

$$(T_0 + R_{thp}/4) \times 0.6 \leq T_1 \leq (T_0 + R_{thp}/4) \times 1.4 \qquad \text{[Inequation 1]}$$

In Inequation 1, $T_1$ denotes an average tilt angle of liquid crystals of a liquid crystal layer, $T_0$ denotes an average tilt angle of liquid crystals when at least one of a reflectance and a reflection color is minimized where the reflectance and the reflection color are measured in a side direction of the circular polarizing plate while disposing a reflector on one surface of the circular polarizing plate, and $R_{thp}$ denotes a thickness direction phase delay of the organic light emitting display panel.

The average tilt angle of the liquid crystals 450a of the liquid crystal layer 450 may, for example, satisfy Inequation 2 considering a phase delay in a thickness direction of the organic light emitting display panel 100.

$$(T_0 + R_{thp}/4) \times 0.8 \leq T_1 \leq (T_0 + R_{thp}/4) \times 1.2 \qquad \text{[Inequation 2]}$$

In Inequation 2, $T_1$ denotes an average tilt angle of liquid crystals, $T_0$ denotes an average tilt angle of liquid crystals when at least one of a reflectance and a reflection color is minimized where the reflectance and the reflection color are measured in a side direction of the circular polarizing plate while disposing a reflector on one surface of the circular polarizing plate, and $R_{thp}$ denotes a thickness direction phase delay of the organic light emitting display panel.

In an embodiment, the minimum tilt angle ($\theta_1$) of the liquid crystals 450a of the liquid crystal layer 450 may be a pretilt angle caused by the alignment layer 440, and may be, for example, greater than about 0° and less than or equal to about 20°, for example. In an embodiment, the minimum tilt angle ($\theta_1$) may be, for example, greater than about 0° and less than or equal to about 15°, for example, greater than about 0° and less than or equal to about 10°, greater than about 0° and less than or equal to about 5°, or about 2° to about 5°.

In an embodiment, the maximum tilt angle ($\theta_2$) of the liquid crystals 450a of the liquid crystal layer 450 may be, for example, about 45° to about 90°. In an embodiment, the maximum tilt angle may be, for example, about 50° to about 90°, about 60° to about 90°, about 70° to about 90°, or about 75° to about 90°.

In an embodiment, the average tilt angle of the liquid crystals 450a of the liquid crystal layer 450 may be, for example, about 30° to about 60°. In an embodiment, the average tilt angle may be, for example, about 35° to about 55°, about 37° to about 53°, or about 39° to about 51°.

In an embodiment, when the thickness direction phase delay of the organic light emitting display panel 100 is less than or equal to about 90 nm, the average tilt angle of the liquid crystals 450a of the liquid crystal layer 450 may be, for example, less than or equal to about 45°, for example. In an embodiment, when the thickness direction phase delay of the organic light emitting display panel 100 is greater than about 90 nm, the average tilt angle of the liquid crystals 450a of the liquid crystal layer 450 may be, for example, greater than about 45°, for example.

Figure 3:
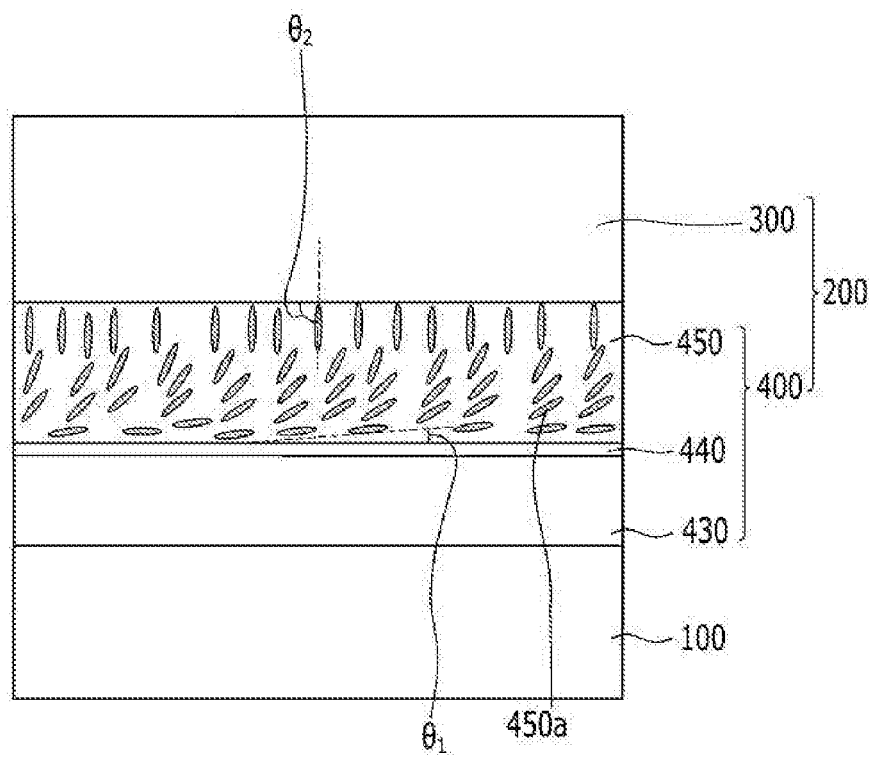
FIG. 3 is a cross-sectional view of an OLED device enlarging another embodiment of a circular polarizing plate that is applied to the OLED device of FIG. 1.

FIG. 3 is a cross-sectional view of an OLED device enlarging another embodiment of a circular polarizing plate that is applied to the OLED device of FIG. 1.

A circular polarizing plate 200 shown in FIG. 3 includes a polarizer 300, and a compensation film 400 including a substrate 430, an alignment layer 440, and a liquid crystal layer 450 like the circular polarizing plate 200 in FIG. 2. The polarizer 300, the substrate 430, the alignment layer 440, and the liquid crystal layer 450 are the same as described above.

However, the circular polarizing plate 200 shown in FIG. 3 has a structure that the liquid crystals 450a of the liquid crystal layer 450 has a tilt angle which becomes larger from the bottom to the top, that is, a top tilt structure unlike the circular polarizing plate 200 shown in FIG. 2. In an embodiment, when the liquid crystal layer 450 has a first surface at the organic light emitting display panel 100 and contacting the alignment layer 440 and a second surface at the polarizer 300, a tilt angle of the liquid crystals 450a may gradually change from the first surface of the liquid crystal layer 450 to the second surface thereof along the thickness direction of the liquid crystal layer 450, for example.

As described above, a maximum tilt angle ($\theta_2$) of the liquid crystals 450a on the second surface of the liquid crystal layer 450 may be optically designed by considering a tilt angle when the circular polarizing plate 200 has a maximum anti-reflection effect and a thickness direction phase delay due to the optical anisotropy of the organic light emitting display panel 100.

In an embodiment, the tilt angle of the liquid crystals 450a may be optically designed to be different from the tilt angle of the liquid crystals 450a when at least one of a reflectance and a reflection color is minimized where the reflectance and the reflection color are measured in a side direction of the circular polarizing plate 200 while disposing a reflector on one surface of the circular polarizing plate, for example. In an embodiment, the maximum tilt angle ($\theta_2$) of the liquid crystals 450a, that is a tilt angle of liquid crystals disposed at the second surface of liquid crystal layer 450 may be greater than the maximum tilt angle of the liquid crystals 450a when at least one of a reflectance and a reflection color is minimized where the reflectance and the reflection color are measured in a side direction of the circular polarizing plate 200 while disposing a reflector on one surface of the circular polarizing plate.

In an embodiment, an absolute value of the thickness direction phase delay of the organic light emitting display panel 100 may be about 20 nm to about 200 nm, for example. In an embodiment, the average tilt angle of the liquid crystals 450a of the liquid crystal layer 450 may satisfy Inequation 1 and/or Inequation 2.

In an embodiment, the minimum tilt angle ($\theta_1$) of the liquid crystals 450a of the liquid crystal layer 450 may be a pretilt angle caused by the alignment layer 440, and may be, for example, greater than about 0° and less than or equal to about 20°. In an embodiment, the minimum tilt angle ($\theta_1$) may be, for example, greater than about 0° and less than or equal to about 15°, for example, greater than about 0° and less than or equal to about 10°, greater than about 0° and less than or equal to about 5°, or about 2° to about 5°.

In an embodiment, the maximum tilt angle ($\theta_2$) of the liquid crystals 450a of the liquid crystal layer 450 may be, for example, about 45° to about 90°. In an embodiment, the maximum tilt angle may be, for example, about 50° to about 90°, about 60° to about 90°, about 70° to about 90°, or about 75° to about 90°.

In an embodiment, the average tilt angle of the liquid crystals 450a of the liquid crystal layer 450 may be, for example, about 30° to about 60°. In an embodiment, the average tilt angle may be, for example, about 35° to about 55°, about 37° to about 53°, or about 39° to about 51°.

In this way, when the tilt angle of the liquid crystals 450a of the liquid crystal layer 450 is optically designed, an anti-reflection effect of the OLED display may be substantially effectively improved by considering a thickness direction phase delay by optical anisotropy of the organic light emitting display panel 100 as well as a phase delay when an anti-reflection effect of the circular polarizing plate 200 is maximum.

Figure 4:
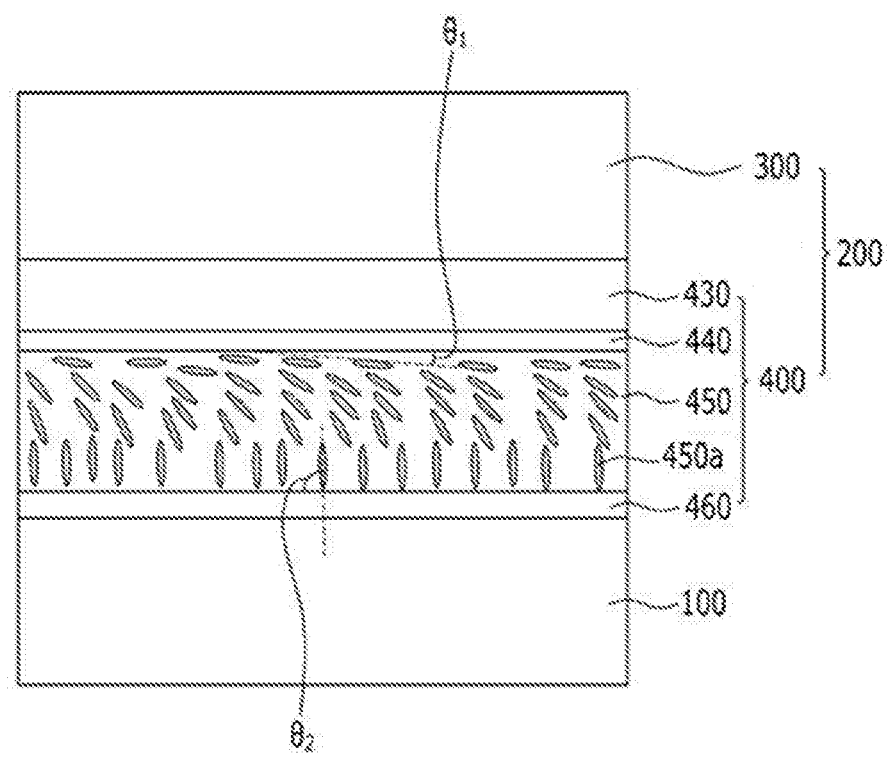
FIG. 4 is a cross-sectional view of an OLED device enlarging another embodiment of a circular polarizing plate that is applied to the OLED device of FIG. 1.

FIG. 4 is a cross-sectional view showing an OLED device enlarging another embodiment of a circular polarizing plate that is applied to the OLED device of FIG. 1.

A circular polarizing plate 200 shown in FIG. 4 includes a polarizer 300, and a compensation film 400 including a substrate 430, an alignment layer 440, and a liquid crystal layer 450 having a bottom tilt structure like the circular polarizing plate 200 in FIG. 2. The polarizer 300, the substrate 430, the alignment layer 440, and the liquid crystal layer 450 are the same as described above.

However, the circular polarizing plate 200 shown in FIG. 4 further includes an auxiliary layer 460 positioned on one surface of the liquid crystal layer 450 unlike the circular polarizing plate 200 shown in FIG. 2.

In an embodiment, the auxiliary layer 460 may include, for example, a polymer, a liquid crystal, or a combination thereof.

The auxiliary layer 460 may satisfy, for example, Inequation 6.

$$n_{z2} > n_{x2} = n_{y2}$$ [Inequation 6]

In Inequation 6, $n_{x2}$ denotes a refractive index in a direction having a highest in-plane refractive index of the auxiliary layer, $n_{y2}$ denotes a refractive index in a direction having a lowest in-plane refractive index of the auxiliary layer, and $n_{z2}$ denotes a refractive index in a thickness direction of the auxiliary layer In an embodiment, the auxiliary layer 460 may include, for example, liquid crystals such as homeotropic liquid crystals.

Figure 5:
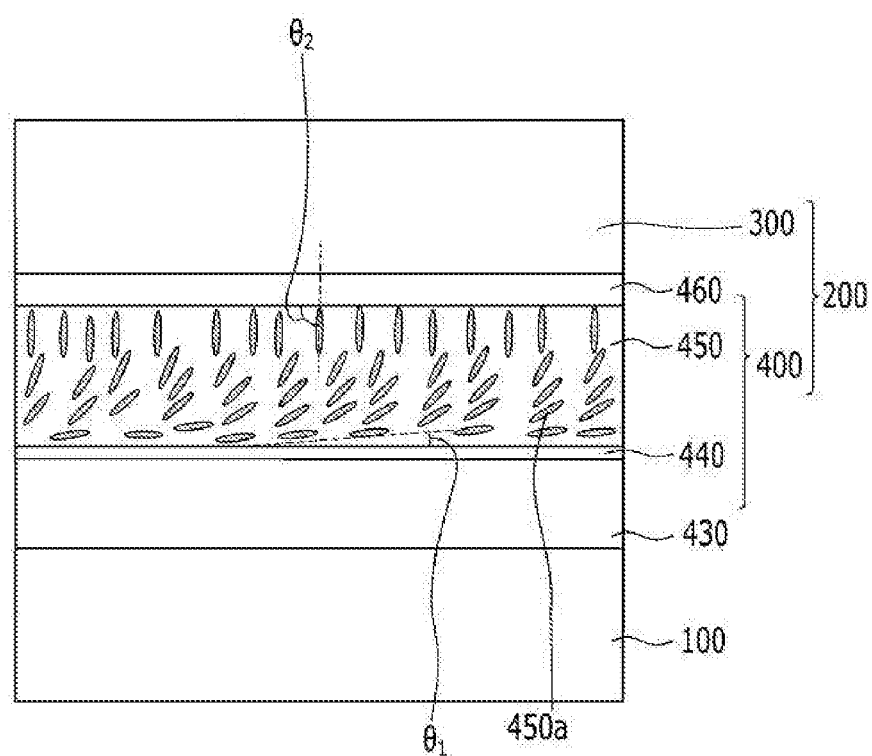
FIG. 5 is a cross-sectional view of an OLED device enlarging another embodiment of a circular polarizing plate that is applied to the OLED device of FIG. 1.

FIG. 5 is a cross-sectional view of an OLED device enlarging another embodiment of a circular polarizing plate that is applied to the OLED device of FIG. 1.

A circular polarizing plate 200 shown in FIG. 5 includes a polarizer 300, and a compensation film 400 including a substrate 430, an alignment layer 440, and a liquid crystal layer 450 having a top tilt structure like the circular polarizing plate 200 in FIG. 2. The polarizer 300, the substrate 430, the alignment layer 440, and the liquid crystal layer 450 are the same as described above.

However, the circular polarizing plate 200 shown in FIG. 5 further includes an auxiliary layer 460 positioned on one surface of the liquid crystal layer 450 unlike the circular polarizing plate 200 shown in FIG. 3. The auxiliary layer 460 is the same as described above.

In this way, anti-reflection characteristics of an OLED device may be substantially effectively improved by realizing a circular polarizing plate including a liquid crystal layer having a structure that a tilt angle of liquid crystals changes along a thickness direction, that is, a bottom tilt structure or a top tilt structure and optically designing the tilt angle of the liquid crystals of the liquid crystal layer by considering a thickness direction phase delay of the organic light emitting display panel.

Hereinafter, the invention is illustrated in more detail with reference to examples. However, these examples are exemplary, and the invention is not limited thereto.

<Manufacture of Circular Polarizing Plate>

Preparation Example 1

An alignment layer is provided by coating polyamic acid (SE-7492, Nissan Chemical industries Ltd.) on a glass substrate, baking it at 200 degrees Celsius (° C.) for 1 hour, and rubbing it. Subsequently, on the alignment layer, liquid crystals (RMS03-011, Merck & Co., Ltd.) are spin-coated, procured, and then, UV-radiated with 500 mJ while heated to form a liquid crystal layer and resultantly, prepare a compensation film.

Herein, the liquid crystal layer includes the liquid crystals of which a tilt angle gradually changes along the thickness direction, and the liquid crystals contacting the alignment layer have a minimum tilt angle of about 3°, while the liquid crystals disposed on top have a maximum tilt angle of about 30°, and the liquid crystal layer has an average tilt angle of about 17°. Subsequently, a polarizer (SEG1425DU, Nitto Denko Co. Ltd.) is adhered to one surface of the compensation film to manufacture a circular polarizing plate.

Preparation Example 2

A circular polarizing plate is manufactured according to the same method as Preparation Example 1 except that the liquid crystal layer has a maximum tilt angle of about 45° and an average tilt angle of about 24°.

Preparation Example 3

A circular polarizing plate is manufactured according to the same method as Preparation Example 1 except that the liquid crystal layer has a maximum tilt angle of about 70° and an average tilt angle of about 37°.

Preparation Example 4

A circular polarizing plate is manufactured according to the same method as Preparation Example 1 except that the liquid crystal layer has a maximum tilt angle of about 90° and an average tilt angle of about 47°.

Comparative Preparation Example 1

A circular polarizing plate is manufactured according to the same method as Preparation Example 1 except for using horizontally-aligned liquid crystals (RMS03-013C, Merck & Co., Ltd.) (an average tilt angle of 0°) instead of the liquid crystals (RMS03-011, Merck & Co., Ltd.).

<Manufacture of OLED Device>

Example 1

An OLED device is manufactured by attaching the circular polarizing plate of Preparation Example 1 on one side of an organic light emitting display panel (Galaxy S4 panel, Samsung Display).

Example 2

An OLED device is manufactured by attaching the circular polarizing plate of Preparation Example 2 on one side of an organic light emitting display panel (Galaxy S4 panel, Samsung Display).

Example 3

An OLED device is manufactured by attaching the circular polarizing plate of Preparation Example 3 on one side of an organic light emitting display panel (Galaxy S4 panel, Samsung Display).

Example 4

An OLED device is manufactured by attaching the circular polarizing plate of Preparation Example 4 on one side of an organic light emitting display panel (Galaxy S4 panel, Samsung Display).

Example 5

An OLED device is manufactured by attaching the circular polarizing plate of Comparative Preparation Example 1 on one side of an organic light emitting display panel (Galaxy S4 panel, Samsung Display).

Reference Example 1

A comparative sample is manufactured by attaching the circular polarizing plate of Preparation Example 1 on one side of a reflector.

Reference Example 2

A comparative sample is manufactured by attaching the circular polarizing plate of Preparation Example 2 on one side of a reflector.

Reference Example 3

A comparative sample is manufactured by attaching the circular polarizing plate of Preparation Example 3 on one side of a reflector.

Reference Example 4

A comparative sample is manufactured by attaching the circular polarizing plate of Preparation Example 4 on one side of a reflector.

Reference Example 5

A comparative sample is manufactured by attaching the circular polarizing plate of Comparative Preparation Example 1 on one side of a reflector.

<Evaluation 1>

The OLED devices according to Examples 1 to 5 and the comparative samples according to Reference Examples 1 to 5 are respectively measured regarding reflectance and a color shift at 45° to find out which OLED device and comparative sample show the smallest color shift.

The color shift may be expressed as $\Delta a^*b^* = \sqrt{a^{*2}+b^{*2}}$ by using a CIE-Lab color coordinate, where, positive a* indicates red, negative a* indicates green, positive b* indicates yellow, and negative b* indicates blue. A larger absolute value of the a* and the b* indicates a stronger color, a smaller color shift indicates a color tone closer to black by reflection and less changes of color tones, which exhibits satisfactory visibility. The color shift is measured by using Shimadzu Solid-state 3700.

As a result, the OLED device of Example 3 (70° of a maximum tilt angle of liquid crystals) among the OLED devices according to Examples 1 to 5 exhibits the smallest color shift and the most ordered cromaticity, while the comparative sample of Reference Example 2 (45° of a maximum tilt angle of liquid crystals) among the comparative samples according to Reference Examples 1 to 5 exhibits the smallest color shift and the most ordered cromaticity.

Accordingly, a case of disposing an organic light emitting display panel on one surface of a circular polarizing plate has a different maximum tilt angle of liquid crystals for a maximum anti-reflection effect from a case of disposing a reflector on one surface of a circular polarizing plate.

In order to substantially improve anti-reflection characteristics of an OLED device, a tilt angle of a liquid crystal layer needs to be optically designed by considering a phase delay of the organic light emitting display panel.

<Optical Design I of Compensation Film>

A compensation film is optically designed to have a tilt angle of liquid crystals minimizing reflectance and/or a color shift of an OLED device by setting an absolute value of a thickness direction phase delay of an organic light emitting display panel to be about 60 nm.

Examples 6 to 11

For the optical design simulation, an OLED device is manufactured to have a structure of sequentially disposing a compensation film including a polarizer and a liquid crystal layer and an organic light emitting display panel and setting liquid crystals of the liquid crystal layer to have a minimum tilt angle of 3° and respectively a maximum tilt angle of 15° (Example 6), 30° (Example 7), 45° (Example 8), 60° (Example 9), 75° (Example 10), and 90° (Example 11), and reflectance and a color shift of the liquid crystal layer are evaluated depending on a maximum tilt angle.

Reference Examples 6 to 11

For an optical design simulation, a comparative sample is manufactured to have a structure by sequentially disposing a compensation film including a polarizer and a liquid crystal layer and a reflector and setting liquid crystals of the liquid crystal layer to have a minimum tilt angle of 3° and respectively a maximum tilt angle of 15° (Reference Example 6), 30° (Reference Example 7), 45° (Reference Example 8), 60° (Reference Example 9), 75° (Reference Example 10), and 90° (Reference Example 11), and then, reflectance and a color shift of the liquid crystal layer are evaluated.

<Evaluation 2>

Reflectance and a color shift of Examples 6 to 11 and Reference Examples 6 to 11 are evaluated. The reflectance and color shift are evaluated by using a LCD master (Shintech Inc.).

Figure 7:
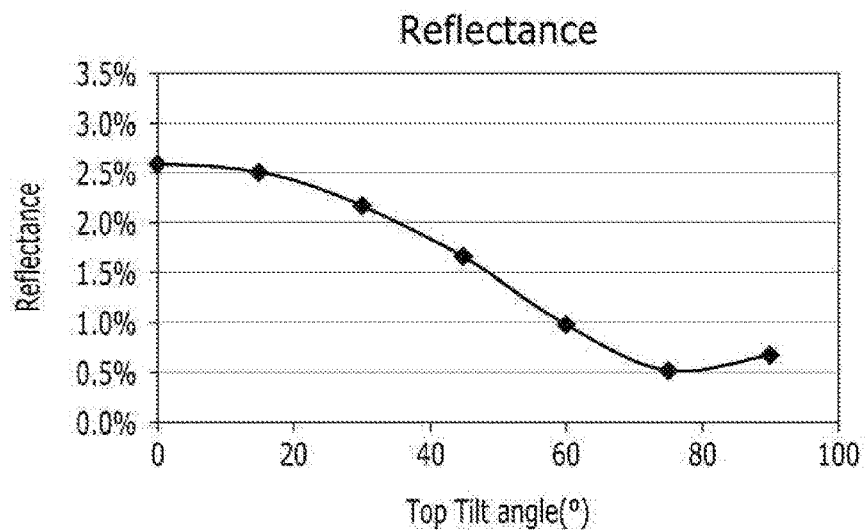
FIG. 7 is a graph showing reflectance of the OLED devices according to Examples 6 to 11.
Figure 8:
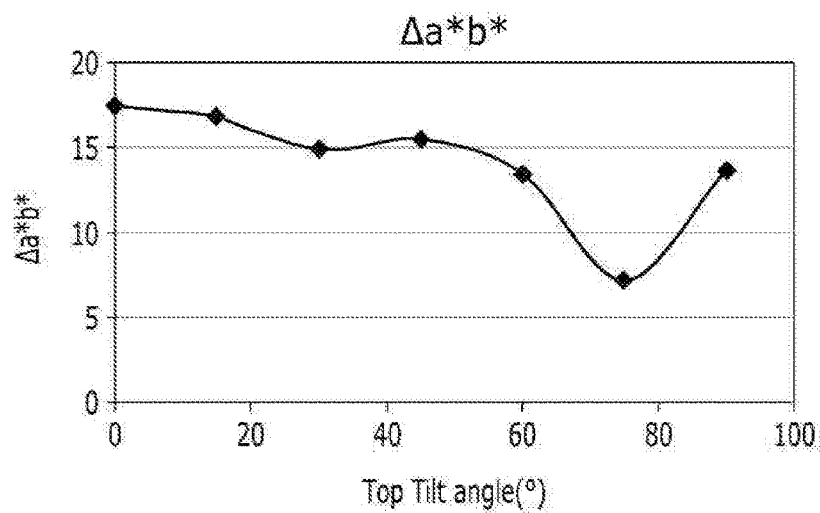
FIG. 8 is a graph showing color shifts of the OLED devices according to Examples 6 to 11.
Figure 9:
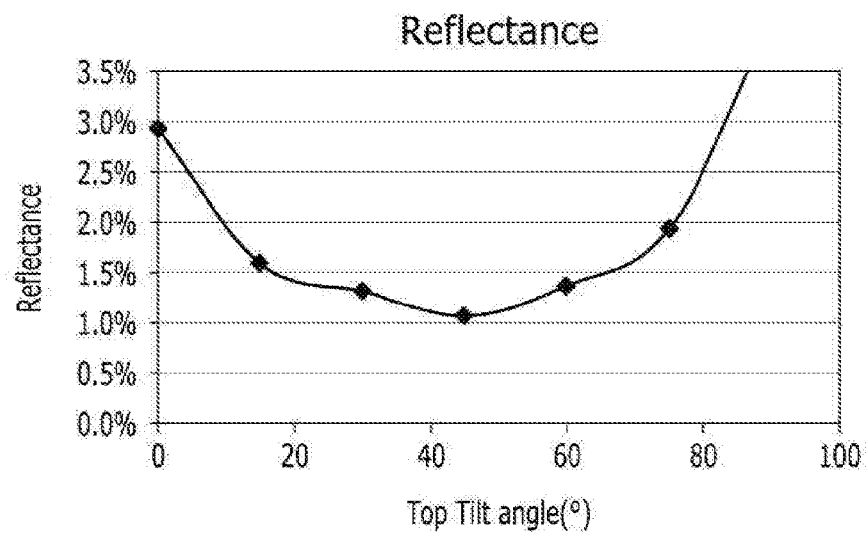
FIG. 9 is a graph showing reflectance of the Comparative samples according to Reference Examples 6 to 11.
Figure 10:
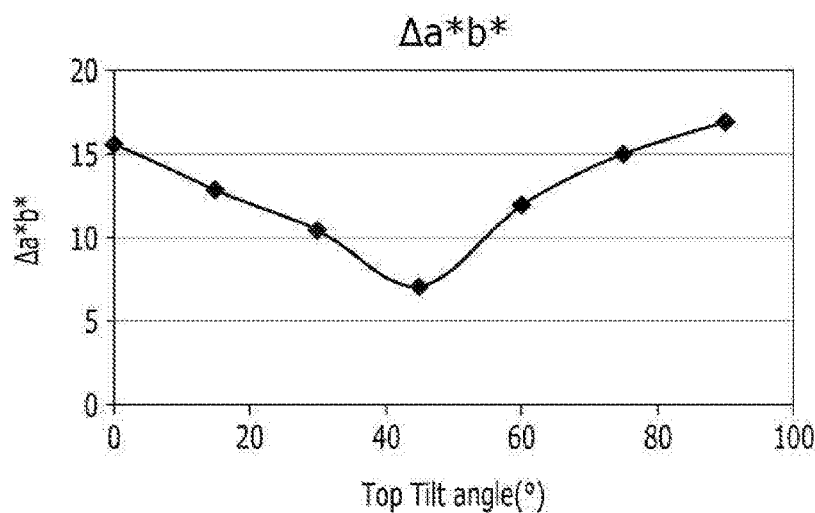
FIG. 10 is a graph showing color shifts of the Comparative samples according to Reference Examples 6 to 11.

FIG. 7 is a graph showing reflectance of the OLED devices according to Examples 6 to 11, FIG. 8 is a graph showing color shifts of the OLED devices according to Examples 6 to 11, FIG. 9 is a graph showing reflectance of the Comparative samples according to Reference Examples 6 to 11, and FIG. 10 is a graph showing color shifts of the Comparative samples according to Reference Examples 6 to 11.

Referring to FIGS. 7 and 8, the OLED device (75° of a maximum tilt angle of liquid crystals) according to Example 10 exhibits the smallest reflectance and color shift among the OLED devices according to Examples 6 to 11.

On the contrary, referring to FIGS. 9 and 10, the comparative sample (45° of a maximum tilt angle of liquid crystals) according to Reference Example 8 exhibits the smallest reflectance and color shift among the comparative samples according to Reference Examples 6 to 11.

Accordingly, a case of disposing an organic light emitting display panel on one surface of a circular polarizing plate has a different maximum tilt angle of liquid crystals for a maximum anti-reflection effect from a case of disposing a reflector on one surface of a circular polarizing plate.

Accordingly, in order to substantially improve anti-reflection characteristics of an OLED device, a tilt angle of a liquid crystal layer may be optically designed by considering a phase delay of an organic light emitting display panel.

<Optical Design II of Compensation Film>

A compensation film is optically designed to have a tilt angle of liquid crystals minimizing reflectance and/or a color shift of each OLED device by setting an absolute value of a thickness direction phase delay of an organic light emitting display panel to respectively be about 60 nm, 70 nm, 80 nm, 90 nm, 100 nm, and 110 nm. The compensation film has 138 nm of in-plane retardation ($R_e$) about a reference wavelength of 550 nm, about 0.84 of an in-plane retardation ratio (Re (450 nm)/Re (550 nm)), and about 1.01 of an in-plane retardation ratio (Re (650 nm)/Re (550 nm)).

The reflectance and reflection color are evaluated by using a LCD master (Shintech Inc.).

Table 1 shows a thickness direction phase delay of an organic light emitting display panel and minimum and maximum tilt angles and average tilt angle of liquid crystals and also, reflectance and a color shift at a side direction of 45° according to the minimum, maximum and average tilt angles.

Referring to Table 1, a maximum tilt angle and an average tilt angle of liquid crystals of a compensation film minimizing reflectance and/or a color shift of an OLED device are changed depending on a thickness direction phase delay of an organic light emitting display panel, and specifically, as the organic light emitting display panel has a larger thickness direction phase delay, the liquid crystals have larger maximum and average tilt angles.

Accordingly, in order to substantially improve anti-reflection characteristics of an OLED device, a tilt angle of a liquid crystal layer is optically designed by considering a phase delay of an organic light emitting display panel.

In addition, when the organic light emitting display panel has an absolute value of a thickness direction phase delay of greater than or equal to 100 nm, a compensation function may be further improved by setting the liquid crystals of the compensation film to have a maximum tilt angle of 90° and simultaneously adding an auxiliary layer (e.g., a C plate) on one surface of the liquid crystal layer.

TABLE 1

| OLED Panel | Tilt angle | | | | Side (45°) | |
|---|---|---|---|---|---|---|
| Rth | Min | Max | Avg | +C plate | Reflectance | Color shift (Δa*b*) |
| −60 nm | 0 | 0 | 0.0 | — | 2.59% | 17.51 |
|  | 3 | 45 | 24.0 | — | 1.65% | 15.51 |
|  | 3 | 60 | 31.5 | — | 0.98% | 13.44 |
|  | 3 | 75 | 39.0 | — | 0.53% | 7.24 |
|  | 3 | 90 | 46.5 | — | 0.68% | 13.65 |
| −70 nm | 0 | 0 | 0.0 | — | 2.98% | 18.10 |
|  | 3 | 45 | 24.0 | — | 1.95% | 15.36 |
|  | 3 | 75 | 39.0 | — | 0.58% | 8.82 |
|  | 3 | 80 | 41.5 | — | 0.51% | 7.67 |
|  | 3 | 85 | 44.0 | — | 0.51% | 8.80 |
|  | 3 | 90 | 46.5 | — | 0.53% | 11.70 |
| −80 nm | 0 | 0 | 0.0 | — | 3.39% | 18.14 |
|  | 3 | 45 | 24.0 | — | 2.29% | 14.54 |
|  | 3 | 75 | 39.0 | — | 0.68% | 10.76 |
|  | 3 | 80 | 41.5 | — | 0.55% | 8.86 |
|  | 3 | 85 | 44.0 | — | 0.50% | 8.54 |
|  | 3 | 90 | 46.5 | — | 0.49% | 10.06 |
|  | 10 | 45 | 27.5 |  | 1.79% | 15.54 |
|  | 10 | 70 | 40.0 |  | 0.64% | 10.49 |
|  | 10 | 75 | 42.5 |  | 0.57% | 8.29 |
|  | 10 | 80 | 45.0 |  | 0.57% | 9.47 |
|  | 10 | 85 | 47.5 |  | 0.65% | 11.81 |
|  | 10 | 90 | 50.0 |  | 0.75% | 14.11 |
| −90 nm | 0 | 0 | 0.0 | — | 3.77% | 18.12 |
|  | 3 | 45 | 24.0 | — | 2.59% | 15.02 |
|  | 3 | 75 | 39.0 | — | 0.79% | 12.30 |
|  | 3 | 85 | 44.0 | — | 0.53% | 9.18 |
|  | 3 | 90 | 46.5 | — | 0.50% | 9.90 |
|  | 0 | 0 | 0.0 | — | 4.23% | 18.06 |
|  | 3 | 45 | 24.0 | — | 2.97% | 16.27 |
|  | 3 | 75 | 39.0 | — | 0.96% | 14.07 |
|  | 3 | 85 | 44.0 | — | 0.61% | 10.87 |
|  | 3 | 90 | 46.5 | — | 0.54% | 10.62 |
|  | 3 | 90 | 48.0 | 10 nm | 0.49% | 10.12 |
|  | 3 | 90 | 49.3 | 20 nm | 0.48% | 10.21 |
|  | 3 | 90 | 51.8 | 40 nm | 0.61% | 13.44 |
| −110 nm | 0 | 0 | 0.0 | — | 4.72% | 18.01 |
|  | 3 | 45 | 24.0 | — | 3.16% | 17.20 |
|  | 3 | 75 | 39.0 | — | 1.16% | 15.41 |
|  | 3 | 85 | 44.0 | — | 0.73% | 12.80 |
|  | 3 | 90 | 46.5 | — | 0.63% | 11.93 |
|  | 3 | 90 | 48.0 | 10 nm | 0.54% | 11.01 |
|  | 3 | 90 | 49.3 | 20 nm | 0.49% | 10.48 |
|  | 3 | 90 | 50.6 | 30 nm | 0.47% | 10.46 |
|  | 3 | 90 | 51.8 | 40 nm | 0.48% | 11.46 |

While this disclosure has been described in connection with what is presently considered to be practical example embodiments, it is to be understood that the present disclosure is not limited to the disclosed embodiments, but, on the contrary, is intended to cover various modifications and equivalent arrangements included within the spirit and scope of the appended claims.

What is claimed is:

1. An organic light emitting diode device comprising:
an organic light emitting display panel; and
a circular polarizing plate including:
   a polarizer, and
   a compensation film including a liquid crystal layer which includes a first surface and a second surface facing each other, and a plurality of liquid crystals tilting obliquely with respect to an extension direction of the first and second surfaces of the liquid crystal layer, wherein:
tilt angles of the plurality of liquid crystals with respect to the extension direction of the liquid crystal layer become gradually larger from the first surface to the second surface of the liquid crystal layer in a thickness direction of the liquid crystal layer, and
a maximum tilt angle of the plurality of liquid crystals with respect to the extension direction of the liquid crystal layer is determined based on a thickness direction phase delay generated in a thickness direction of the organic light emitting display panel, and
the maximum tilt angle of the plurality of liquid crystals is different from a maximum tilt angle of the plurality of liquid crystals where at least one of a reflectance and a reflection color is minimized, wherein the reflectance and the reflection color are measured in a side direction of the circular polarizing plate while disposing a reflector on one surface of the circular polarizing plate.

2. The organic light emitting diode device of claim 1, wherein the maximum tilt angle of the plurality of liquid crystals is greater than a maximum tilt angle of the plurality of liquid crystals when at least one of a reflectance and a reflection color is minimized, and
wherein the reflectance and the reflection color are measured in a side direction of the circular polarizing plate while disposing a reflector on one surface of the circular polarizing plate.

3. The organic light emitting diode device of claim 1, wherein an average tilt angle of the plurality of liquid crystals satisfies Inequation 1:

$$(T_0+R_{thp}/4)\times 0.6 \leq T_1 \leq (T_0+R_{thp}/4)\times 1.4 \qquad \text{[Inequation 1]}$$

wherein, in Inequation 1,
$T_1$ denotes an average tilt angle of the plurality of liquid crystals,
$T_0$ denotes an average tilt angle of the plurality of liquid crystals when at least one of a reflectance and a reflection color is minimized wherein the reflectance and the reflection color are measured in a side direction of the circular polarizing plate while disposing a reflector on one surface of the circular polarizing plate, and
$R_{thp}$ denotes the thickness direction phase delay of the organic light emitting display panel.

4. The organic light emitting diode device of claim 1, wherein an average tilt angle of the plurality of liquid crystals satisfies Inequation 2:

$$(T_0+R_{thp}/4)\times 0.8 \leq T_1 \leq (T_0+R_{thp}/4)\times 1.2 \qquad \text{[Inequation 2]}$$

wherein, in Inequation 2,
$T_1$ denotes an average tilt angle of liquid crystals,
$T_0$ denotes an average tilt angle of the plurality of liquid crystals when at least one of a reflectance and a reflection color is minimized wherein the reflectance and the reflection color are measured in a side direction of the circular polarizing plate while disposing a reflector on one surface of the circular polarizing plate, and
$R_{thp}$ denotes the thickness direction phase delay of the organic light emitting display panel.

5. The organic light emitting diode device of claim 1, wherein the maximum tilt angle of the plurality of liquid crystals ranges from about 45 degrees to about 90 degrees.

6. The organic light emitting diode device of claim 1, wherein an average tilt angle of the plurality of liquid crystals ranges from about 30 degrees to about 60 degrees.

7. The organic light emitting diode device of claim 1, wherein the organic light emitting display panel satisfies refractive indices of Inequation 3 and 4:

$$n_{xp} > n_{zp} \qquad \text{[Inequation 3]}$$

$$n_{yp} > n_{zp} \qquad \text{[Inequation 4]}$$

wherein, in Inequations 3 and 4, $n_{xp}$ denotes a refractive index in a direction having a highest in-plane refractive index of the organic light emitting display panel, $n_{yp}$ denotes a refractive index in a direction having a lowest in-plane refractive index of the organic light emitting display panel, and $n_{zp}$ denotes a refractive index in a thickness direction of the organic light emitting display panel.

8. The organic light emitting diode device of claim 1, wherein the organic light emitting display panel satisfies a refractive index of Inequation 5:

$$n_{xp} = n_{yp} > n_{zp} \qquad \text{[Inequation 5]}$$

wherein, in Inequation 5, $n_{xp}$ denotes a refractive index in a direction having a highest in-plane refractive index of the organic light emitting display panel, $n_{yp}$ denotes a refractive index in a direction having a lowest in-plane refractive index of the organic light emitting display panel, and $n_{zp}$ denotes a refractive index in a thickness direction of the organic light emitting display panel.

9. The organic light emitting diode device of claim 1, wherein the organic light emitting display panel has an absolute value of the thickness direction phase delay of about 20 nanometers to about 200 nanometers.

10. The organic light emitting diode device of claim 1, wherein the first surface of the liquid crystal layer faces the polarizer and the second surface of the liquid crystal layer faces the organic light emitting display panel.

11. The organic light emitting diode device of claim 1, wherein the first surface of the liquid crystal layer faces the organic light emitting display panel and the second surface of the liquid crystal layer faces the polarizer.

12. The organic light emitting diode device of claim 1, wherein the compensation film further includes an auxiliary layer on one surface of the liquid crystal layer and the auxiliary layer satisfies Inequation 6:

$$n_{z2} > n_{x2} = n_{y2} \qquad \text{[Inequation 6]}$$

wherein, in Inequation 6, $n_{x2}$ denotes a refractive index in a direction having a highest in-plane refractive index of the auxiliary layer, $n_{y2}$ denotes a refractive index in a direction having a lowest in-plane refractive index of the auxiliary layer, and $n_{z2}$ denotes a refractive index in a thickness direction of the auxiliary layer.

13. The organic light emitting diode device of claim 12, wherein the auxiliary layer includes a polymer, a liquid crystal, or a combination thereof.

14. The organic light emitting diode device of claim 13, wherein the auxiliary layer further includes a homeotropic liquid crystal.

15. The organic light emitting diode device of claim 1, wherein the organic light emitting display panel includes an organic layer including an aligned organic molecule.

16. The organic light emitting diode device of claim 1, wherein the organic light emitting display panel includes an organic layer including a deposited organic molecule.

17. The organic light emitting diode device of claim 1, wherein the organic light emitting display panel has a microcavity structure.

\* \* \* \* \*